US006952103B2

United States Patent
Herb et al.

(10) Patent No.: US 6,952,103 B2
(45) Date of Patent: Oct. 4, 2005

(54) CIRCUIT AND METHOD FOR DETECTING INSULATION FAULTS

(75) Inventors: Ulrich Herb, Goerisried (DE); Hans-Georg Hornung, Waal (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 10/753,070

(22) Filed: Jan. 8, 2004

(65) Prior Publication Data

US 2004/0189330 A1 Sep. 30, 2004

(30) Foreign Application Priority Data

Jan. 9, 2003 (DE) ............................... 103 00 539

(51) Int. Cl.[7] .............................................. G01R 31/00
(52) U.S. Cl. ................... 324/500; 324/522; 324/158.1
(58) Field of Search ................................ 324/525, 500, 324/503–504, 508–512, 522, 158.1

(56) References Cited

U.S. PATENT DOCUMENTS

| 4,242,631 | A | * | 12/1980 | Hall | 324/649 |
| 4,562,390 | A | * | 12/1985 | Tobise | 318/490 |
| 5,818,236 | A | * | 10/1998 | Sone et al. | 324/509 |
| 6,731,116 | B2 | * | 5/2004 | Yamamoto et al. | 324/522 |

FOREIGN PATENT DOCUMENTS

| DE | 42 03 299 A1 | 1/1992 |
| DE | 196 18 897 A1 | 5/1996 |

OTHER PUBLICATIONS

Schutztechnik und Isolationsueberwachung [Protective technology and insulation monitoring], Wolfgang Hofheinz, 6th Edition, VDE, Chapter 14.3.1, pp. 210–215 (no month/year).

* cited by examiner

Primary Examiner—Minh N. Tang
(74) Attorney, Agent, or Firm—Crowell & Moring LLP

(57) ABSTRACT

A circuit for monitoring the resistance between the terminals of a battery and a first reference potential has two inputs which are each to be connected to one of the terminals of the battery, and a voltage divider. The voltage devider has two external connections each of which is connected to one of the inputs, and a central connection which is to be connected to the first reference potential. First and second switches are arranged in series in a connection between one of the external connections of the voltage divider and one of the inputs. A measuring instrument is connected to the external connections of the voltage divider, for supplying a monitoring signal which is representative of the voltage between the external connections.

11 Claims, 1 Drawing Sheet

CIRCUIT AND METHOD FOR DETECTING INSULATION FAULTS

BACKGROUND AND SUMMARY OF THE INVENTION

This application claims the priority of German patent document 103 00 539.0, filed 9 Jan. 2003, the disclosure of which is expressly incorporated by reference herein.

The present invention relates to a circuit and method for monitoring the resistance between the terminals of a direct voltage source, such as for example a battery and a first reference potential.

The book "Schutztechnik und Isolationsüberwachung [Protective technology and insulation monitoring]", Wolfgang Hofheinz, 6th Edition, VDE, chapter 14.3.1 describes a circuit for monitoring the resistance and for detecting insulation faults between the terminals of a direct voltage source and a ground potential. This circuit uses in each case two measuring instruments which are each connected between a terminal of the direct voltage source and the ground potential and have an internal resistor Ri. It is thus possible to detect an insulation fault between the ground potential and the respective other terminal of the direct voltage source by reference to a voltage drop at the internal resistor Ri, which results from a flow of current from the one terminal to ground via the measuring instrument, and from ground to the other terminal via the insulation fault. A third measuring instrument is used to sense the potential difference between the two terminals of the direct voltage source.

The large number of measuring instruments required to implement the known circuit make it complicated and costly.

One object of the invention, therefore, is to provide a particularly simple and inexpensive circuit for monitoring the resistance between the terminals of a direct voltage source.

Another object of the invention is to provide a monitoring circuit which requires only a single measuring instrument.

These and other objects and advantages are achieved by the monitoring circuit and method according to the invention, in which the inputs of the single measuring instrument are each connected to the external connections of a voltage divider whose central connection is kept at the first reference potential. Simple circuit breakers are sufficient as switches for switching over between a measurement between the first terminal and the reference potential, the second terminal and the reference potential or between the two terminals. The resistors which are connected in series between the external connection and the central connection of the voltage divider are preferably identical.

In order to permit measurement even when there are high output voltages of the battery, a protective resistor is preferably connected in series in each connection between one of the external connections of the voltage divider and one of the inputs of the circuit, the protective resistors also in turn preferably being identical.

A control unit is preferably provided for automated resistance monitoring, for the purpose, inter alia, of opening and closing the first and second switches in phase opposition.

The resistors of the voltage divider and the protective resistors are preferably ohmic resistors; but under certain circumstances, resistors with a virtual component of the resistance value are also possible.

An inexpensive differential amplifier can be used as a measuring instrument. If it is connected to a second reference potential as a supply potential (which under certain circumstances can differ from the first reference potential) there is preferably provision of a test voltage source having two terminals: The first terminal is connected to a point on the circuit which connects the second reference potential, and the second terminal is connected via a third switch to one of the external connections of the voltage divider. By closing the third switch so that the potential of the second terminal of the test voltage source connected to the measuring instrument, it is possible to detect whether the voltage applied to the measuring instrument differs significantly from a known output voltage of the test voltage source. It is thus possible to infer a potential difference between the first and second reference potential.

Such a difference in potential may occur in particular if i) the switches, the resistors and the measuring instrument are combined in one structural unit, ii) the central connection of the voltage divider is connected by a first line to the first externally defined reference potential and iii) a voltage drop can occur on a second line which connects the abovementioned point with the first reference potential (outside the structural unit), and thus defines the second reference potential.

The circuit according to the invention is preferably used to sense insulation faults on a battery which is installed in a vehicle, in particular an electrically driven vehicle. In this case, the first reference potential is preferably the vehicle ground.

In order to sense the resistance between the battery terminals and the first reference potential, the first switch is preferably alternately closed and the second opened in order to sense a first voltage which is then applied to the measuring circuit. The first switch is then opened and the second switch closed in order to sense a second voltage which is applied, and an insulation fault is indicated if at least one of the sensed voltages exceeds a limiting value.

In order to preclude functional faults in the circuit for such a measurement, various test steps are preferably carried out.

A first such test step comprises opening all switches, sensing the voltage which is then applied to the measuring circuit and which should be zero at this time, apart from an offset of the measuring instrument, and detecting a fault in the circuit if the voltage exceeds a limiting value by virtue of the fact that it is, for example, negative or greater than 0.1 V.

A further test step comprises opening the first and second switches and closing the third switch in order to sense possible differences between the first and second reference potentials, and detecting a fault in the circuit if the voltage exceeds a limiting value, for example if it is outside 0±0.8 V.

By closing the first and second switches and opening the third, a fixed fraction of the terminal voltage of the battery is applied to the measuring instrument. This fraction should also lie within a setpoint range in order to preclude disruption to the battery or to the first or second switch.

Other objects, advantages and novel features of the present invention will become apparent from the following detailed description of the invention when considered in conjunction with the accompanying drawings.

BRIEF DESCRIPTION OF THE DRAWINGS

The single FIGURE of the drawing is a schematic circuit diagram of a monitoring device 1 according to the invention, and of its surroundings.

DETAILED DESCRIPTION OF THE DRAWINGS

Figure 1:
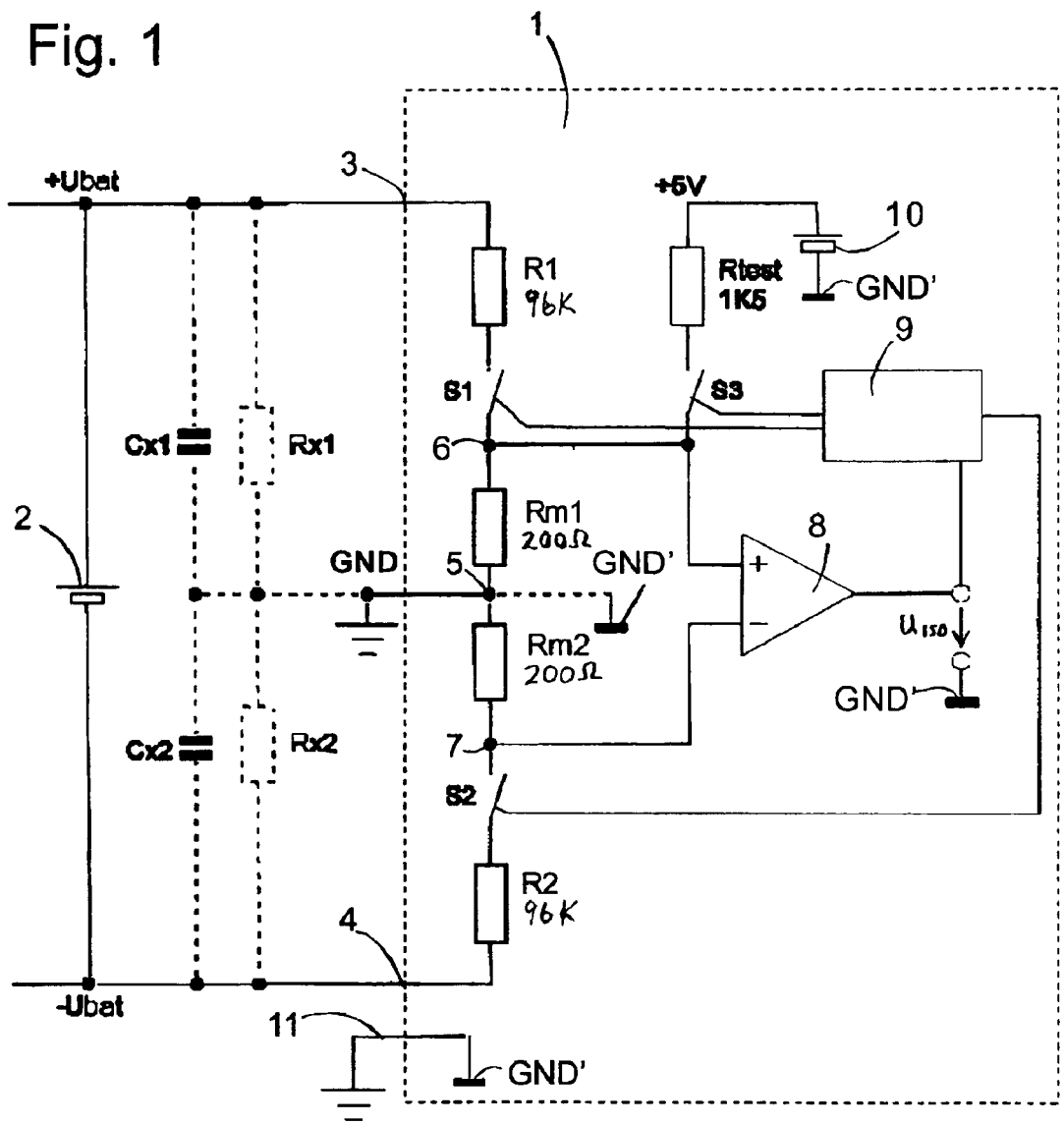

The monitoring device 1 is, for example, installed in an electrically driven vehicle and monitors the insulation resistance of a traction battery 2 of the vehicle, for example a fuel cell stack. A noninverting insulation resistor can occur between the positive terminal of the battery 2 with the potential ±Ubat and the ground GND of the vehicle, between the negative terminal with the potential −Ubat and the vehicle ground GND or between both terminals, and can have in each case real components, illustrated in the figure as resistors Rx1, Rx2, as well as virtual components, illustrated as capacitances Cx1, Cx2.

Two inputs 3, 4 of the monitoring device 1 are connected to the two terminals of the battery 2. In the monitoring device 1, the inputs 3, 4 are connected by a series circuit comprising a first protective resistor R1, a circuit breaker S1, a first measuring resistor Rm1, a second measuring resistor Rm2, a second circuit breaker S2 and a second protective resistor R2. The vehicle ground GND is connected to the center point 5 of the series circuit between the two measuring resistors Rm1, Rm2. The two measuring resistors Rm1, Rm2 may be embodied as a voltage divider with external connections 6, 7. The external connections 6, 7 are connected to inputs of a differential amplifier 8. The output of the differential amplifier 8 supplies an output voltage Uiso which is proportional to the terminal voltage of the battery 2 if both switches S1, S2 are closed, and is representative of a possible insulation fault between the terminal of the battery 2 which is connected to the open switch, and the vehicle ground GND if one of the switches S1, S2 is closed and the other is open.

The measuring resistors Rm1, Rm2 and the protective resistors are each identical to one another; i.e., they have the same resistance values within the tolerance range for which they are specified, or to the extent that is necessary for the desired measuring accuracy of the circuit.

The external connection 6 is connected via a third switch S3 and a protective resistor Rtest to a potential which is made available by a reference voltage source 10, and which may be a supply potential of the differential amplifier 8. It has a level of +5 V with respect to a local ground GND' of the monitoring device 1. Although this local ground GND' of the printed circuit board on which the components of the monitoring device 1 are installed is connected to the vehicle ground GND via a line 11, it is possible that a flow of current or induction due to an external electromagnetic field on such a line wire causes a difference in voltage between the vehicle ground GND and the local ground GND' of the printed circuit board.

The switches S1, S2, S3 are controlled by an electronic control unit 9 (for example, a microcontroller) which also receives and evaluates the output signal Uiso of the differential amplifier 8.

At the start of a test sequence which is carried out by the control unit 9, all the switches S1, S2, S3 are opened. As a result, the inputs of the differential amplifier 8 are drawn to the ground GND via the measuring resistors Rm1, Rm2, and the output signal Uiso of the differential amplifier 8 should ideally be zero. If Uiso assumes values less than 0 V or more than 0.1 V in this stage, a fault in one of the switches S1, S2, S3 or in the differential amplifier 8 is suspected and the control unit 9 outputs a fault message of a first type, which message indicates a fault in the circuit 1.

In a subsequent step, the control unit 9 closes the switch 53, but the switches S1, S2 remain open. In this state, the vehicle ground GND is present at the inverting (negative) input of the differential amplifier 8, and a fraction (defined by the ratio of the resistor Rtest and Rm) of the output voltage of the source 10 is present at the non-inverting (positive) input of the differential amplifier 8, possibly shifted by a potential difference between the local ground and vehicle ground. The control unit 9 compares Uiso with an anticipated voltage U=G×Uq×(Rm/(Rm+Rtest)), G being amplification of the differential amplifier 8. The greater the deviation between the anticipated and measured voltages, the greater the potential difference between the vehicle ground and local ground. When there is a potential difference of more than 1 V (which corresponds to a measured voltage |Uiso|>0.8 V when Rm1=200 Ω, Rtest=1 kΩ and G=4.7) it is assumed that there is a fault in the monitoring circuit 1, and the control unit 9 generates a fault message of the first type.

In a last test step, the control unit closes the switches S1, S2 and opens S3. In this state, a fraction of the output voltage of the battery 2 which is defined by the ratio (Rm1+Rm2)/(R1+R2+Rm1+Rm2) is present at the inputs of the differential amplifier 8. The smaller the possible leakage currents which the device is to be capable of sensing, the lower it is necessary to set the degree of deviation between U and Uiso which is accepted by the control unit 9 without it detecting a fault. Deviations of ±10% of the expected value are typically still accepted as being correct. If this deviation is exceeded, the control unit 9 in turn generates a fault message of the first type.

The insulation resistance is actually measured only if the test steps described above have been carried out without a fault having been detected. In order to measure the insulation resistance $R_{x1}$ between +Ubat and the vehicle ground, the control unit 9 closes the switch S2, while the switches S1, S3 are open. The current can then flow from +$U_{bat}$ via a possible insulation resistor Rx1, Cx1 to the vehicle ground GND and from there via the second measuring resistor Rm2, the second switch S2 and the second protective resistor R2 to the negative terminal. The resulting voltage drop at the second measuring resistor Rm2 is completely present at the inputs of the differential amplifier 8 (when the input resistance of the differential amplifier 8 is assumed to be infinite), and is amplified to form the measurement signal Uiso.

In order to measure the insulation resistance $R_{x2}$ between the vehicle ground GND and the negative connection terminal −Ubat of the battery 1 it is sufficient to close the switch S1 and open the switch S2. A possible leakage current then leads to a positive voltage drop at the first measuring resistor Rm1, which is in turn amplified by the differential amplifier 8. The control unit 9 compares the measured values which are obtained with a predefined limiting value and detects an insulation fault (i.e., it outputs a fault message of a second type) if at least one of these measured values exceeds the limiting value.

In order to avoid a falsification of the measurement as a result of parasitic capacitances Cx1, Cx2 between the terminals of the battery 2 and ground, during each measurement a transient recovery time of approximately five seconds is provided by the control unit 9 between the setting of the switches S1, S2 and the reading of the measurement voltage Uiso, resulting from the respective switch position.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A circuit for monitoring resistance between the terminals of a battery and a first reference potential, said circuit comprising:
   first and second inputs each of which is connectable to one of the terminals of the battery;
   a voltage divider comprising first and second measurement resistors and having first and second external connections, and a central connection intermediate said first and second resistors, which central connection is connectable to the first reference potential;
   first and second switches, each of which is arranged in series in a connection between one of the external connections of the voltage divider and one of the inputs; and
   a measuring instrument, connected to the external connections of the voltage divider, for supplying a monitoring signal which is representative of a voltage between the external connections; wherein,
   the measuring instrument is a differential amplifier;
   the differential amplifier is connected to a second reference potential as a supply potential; and
   a test voltage source is provided having two terminals, one terminal being connected to a point on the circuit which supplies the second reference potential, and the other terminal being connected to one of the external connections of the voltage divider via a third switch.

2. The circuit as claimed in claim 1, wherein said measurement resistors:
   are each connected in series between the central connection and one of the first and second external connections of the voltage divider; and
   are identical.

3. The circuit as claimed in claim 2, wherein the measurement resistors and protective resistors are ohmic resistors.

4. The circuit as claimed in claim 1, wherein each connection between one of the external connections of the voltage divider and one of the inputs includes a protective resistor connected in series therewith.

5. The circuit as claimed in claim 4, wherein the protective resistors included in said connections between the external connections and the inputs are identical.

6. The circuit as claimed in claim 1, further comprising a control unit for opening and closing the first and second switches in phase opposition.

7. The circuit as claimed in claim 1, wherein:
   the switches, the resistors and the measuring instrument are combined in a single structural unit;
   the central connection of the voltage divider is connected by means of a first line to the first reference potential; and
   the second reference potential is defined by a second line which connects the point on the circuit to the first reference potential.

8. A vehicle having a battery and a circuit as claimed in claim 1, wherein the first reference potential is the vehicle ground.

9. A method of operating a test circuit for monitoring resistance between the terminals of a battery and a first reference potential, said circuit having first and second inputs each of which is connectable to one of the terminals of the battery a voltage divider comprising first and second measurement resistors and having first and second external connections and a central connection intermediate said first and second resistors, which central connection is connectable to the first reference potential; first and second switches, each of which is arranged in series in a connection between one of the external connections of the voltage divider and one of the inputs; and a measuring instrument, connected to the external connections of the voltage divider, for supplying a monitoring signal which is representative of a voltage between the external connections, said method comprising:
   closing the first switch and opening the second switch;
   sensing a first voltage which is applied to the measuring instrument;
   opening the first switch and closing the second switch;
   sensing a second voltage which is applied to the measuring instrument;
   detecting an insulation fault if one of the sensed voltages exceeds a limiting value;
   opening all switches;
   sensing a voltage which is present at the measuring instrument; and
   detecting a fault in the circuit if said voltage lies outside a setpoint range.

10. A method of operating a test circuit for monitoring resistance between the terminals of a battery and a first reference potential, said circuit having first and second inputs each of which is connectable to one of the terminals of the battery; a voltage divider comprising first and second measurement resistors and having first and second external connections and a central connection intermediate said first and second resistors, which central connection is connectable to the first reference potential; first and second switches, each of which is arranged in series in a connection between one of the external connections of the voltage divider and one of the inputs; and a measuring instrument, connected to the external connections of the voltage divider, for supplying a monitoring signal which is representative of a voltage between the external connections, said method comprising:
   closing the first switch and opening the second switch;
   sensing a first voltage which is applied to the measuring instrument;
   opening the first switch and closing the second switch;
   sensing a second voltage which is applied to the measuring instrument;
   detecting an insulation fault if one of the sensed voltages exceeds a limiting value;
   opening the first and second switches and closing a third switch;
   sensing a voltage which is applied to the measuring instrument; and
   detecting a fault in the circuit if the voltage lies outside a setpoint range; wherein,
   the measuring instrument is a differential amplifier;
   the differential amplifier is connected to a second reference potential as a supply potential; and
   a test voltage source is provided having two terminals, one terminal being connected to a point on the circuit which supplies the second reference potential, and the other terminal being connected to one of the external connections of the voltage divider via the third switch.

11. The method as claimed in claim 10, further comprising
   closing the first, second and third switches;
   sensing a voltage which is applied to the measuring instrument; and
   detecting a fault in the circuit if the voltage lies outside a setpoint range.

* * * * *